United States Patent
Sasaki

(10) Patent No.: US 7,897,009 B2
(45) Date of Patent: Mar. 1, 2011

(54) PLASMA PROCESSING APPARATUS

(75) Inventor: Masaru Sasaki, Amagasaki (JP)

(73) Assignee: Tokyo Electron Limited, Tokyo (JP)

(*) Notice: Subject to any disclaimer, the term of this patent is extended or adjusted under 35 U.S.C. 154(b) by 827 days.

(21) Appl. No.: 11/722,017

(22) PCT Filed: Dec. 16, 2005

(86) PCT No.: PCT/JP2005/023109
§ 371 (c)(1),
(2), (4) Date: Jun. 18, 2007

(87) PCT Pub. No.: WO2006/064898
PCT Pub. Date: Jun. 22, 2006

(65) Prior Publication Data
US 2008/0142159 A1 Jun. 19, 2008

(30) Foreign Application Priority Data
Dec. 17, 2004 (JP) ............................ 2004-365919

(51) Int. Cl.
C23C 16/00 (2006.01)
C23F 1/00 (2006.01)
H01L 21/306 (2006.01)
(52) U.S. Cl. .................... 156/345.41; 118/723 MW
(58) Field of Classification Search ......... 118/723 MW; 156/345.41
See application file for complete search history.

(56) References Cited

U.S. PATENT DOCUMENTS

| | | | | |
|---|---|---|---|---|
| 6,091,045 A | * | 7/2000 | Mabuchi et al. | 219/121.43 |
| 2003/0217812 A1 | * | 11/2003 | Yoshiki et al. | 156/345.41 |
| 2004/0002221 A1 | * | 1/2004 | O'Donnell et al. | 438/710 |
| 2005/0037193 A1 | * | 2/2005 | Sun et al. | 428/332 |

FOREIGN PATENT DOCUMENTS

| | | |
|---|---|---|
| JP | 2000 286237 | 10/2000 |
| JP | 2000 294550 | 10/2000 |
| JP | 2001 181042 | 7/2001 |
| JP | 2002 203839 | 7/2002 |
| JP | 2002 355550 | 12/2002 |

* cited by examiner

Primary Examiner—Parviz Hassanzadeh
Assistant Examiner—Rakesh Dhingra
(74) Attorney, Agent, or Firm—Oblon, Spivak, McClelland, Maier & Neustadt, L.L.P.

(57) ABSTRACT

A plasma processing apparatus (100) includes a plasma generation mechanism; a process container defining a process chamber configured to perform a plasma process on a target substrate; a substrate worktable configured to place the target substrate thereon inside the process container; and an exhaust mechanism configured to decrease pressure inside the process container. A wall (27a) of a support portion (27) for supporting a microwave transmission plate (28) is present in an area having an electron temperature of 1.5 eV or more during plasma generation. A covering portion (60) made of a heat resistant insulator, such as quartz, is disposed to cover the wall (27a).

12 Claims, 5 Drawing Sheets

US 7,897,009 B2

PLASMA PROCESSING APPARATUS

TECHNICAL FIELD

The present invention relates to a plasma processing apparatus for processing a target substrate, such as a semiconductor substrate, by use of plasma.

BACKGROUND ART

In recent years, owing to the demands for higher integration degrees and higher operation speeds of LSIs, design rules for semiconductor devices that constitute LSIs are increasingly miniaturized. Along with this trend, much more strict demands are made on countermeasures for preventing metal contamination in manufacturing semiconductor devices. Particularly, in plasma processing apparatuses for processing a target substrate by use of plasma, it is necessary to prepare a sufficient countermeasure for preventing metal contamination, because a metal is used as a material of the vacuum chamber.

In recent years, there has been proposed a plasma processing apparatus of the RLSA (Radial Line Slot Antenna) microwave plasma type (for example, see Patent Document 1), which can realize a low temperature process by plasma having a high plasma density and a low electron temperature. This plasma processing apparatus of the RLSA type can provide plasma having a high density and a low electron temperature along with good plasma uniformity, and thus can perform a process free from damage to the target substrate.

[Patent Document 1]
Jpn. Pat. Appln. KOKAI Publication No. 2000-294550

DISCLOSURE OF INVENTION

In plasma processing apparatuses of the RLSA type described above, a microwave transmission plate, which has the function of transmitting microwaves, is disposed adjacent to and in parallel with the planar antenna. In general, this microwave transmission plate is supported by a support portion formed of a metal member of, e.g., an Al alloy, and this metal member is exposed to the plasma generation space. Conventionally, metal contamination due to this exposed metal member has attracted essentially no attention.

However, where a process is performed at a low pressure that brings about a high electron temperature in plasma processing apparatuses of the RLSA type, the exposed Al alloy portion is etched by a sputtering effect of plasma, because the electron temperature is high near the microwave transmission plate. Consequently, Al may be scattered and cause Al contamination on the target substrate. As described above, in recent years, along with improvements in performance of semiconductor devices, much more strict demands are made on countermeasures for preventing metal contamination. Accordingly, it is preferable to suppress even small metal contamination as far as possible.

An object of the present invention is to provide a plasma processing apparatus that can perform a plasma process while preventing semiconductor devices from suffering metal contamination due to a metal member inside a process container, as far as possible.

In order to achieve the object described above, according to a first aspect of the present invention, there is provided a plasma processing apparatus comprising:
a plasma generation mechanism;
a process container defining a process chamber configured to perform a plasma process on a target substrate;
a substrate worktable configured to place the target substrate thereon inside the process container; and
an exhaust mechanism configured to decrease pressure inside the process container,
wherein a heat resistant insulator is disposed to cover a member present at least within an area having an electron temperature of 1.5 eV or more during plasma generation inside the process chamber.

In the plasma processing apparatus according to the first aspect, the heat resistant insulator preferably consists essentially of quartz or $Y_2O_3$. The heat resistant insulator is preferably disposed as a coating film formed on the member consisting essentially of a metal. In this case, the coating film of the heat resistant insulator may consist essentially of $Y_2O_3$. The plasma generation mechanism preferably comprises a planar antenna having a plurality of slots, through which microwaves are supplied into the process chamber to generate plasma.

According to a second aspect of the present invention, there is provided a plasma processing apparatus comprising:
a process container defining a process chamber configured to perform a plasma process on a target substrate;
a substrate worktable configured to place the target substrate thereon inside the process container;
an exhaust mechanism configured to decrease pressure inside the process container;
a planar antenna connected to an external microwave generation unit and having a plurality of slots, through which microwaves are supplied into the process chamber to generate plasma;
a microwave transmission plate disposed in parallel with the planar antenna and having a function of transmitting microwaves; and
a covering portion comprising a plasma resistant material disposed to cover a member present at least within an area having an electron temperature of 1.5 eV or more during plasma generation inside the process chamber, In the plasma processing apparatus according to the second aspect, the covering portion is preferably integrally formed with the microwave transmission plate. In this case, the covering portion and the microwave transmission plate preferably consist essentially of quartz. The covering portion may be disposed as a coating film formed on the member consisting essentially of a metal. In this case, the coating film preferably consists essentially of $Y_2O_3$.

In the plasma processing apparatus according to the present invention, a heat resistant insulative material is disposed to cover a member made of, e.g., a metal present within an area having an electron temperature of 1.5 eV or more during plasma generation, Consequently, the member made of, e.g., a metal is effectively protected from a sputtering effect of ions in plasma. Accordingly, the target substrate is reliably prevented from suffering contamination due to a metal, such as Al.

Further, where such a cover is disposed within the area having an electron temperature of 1.5 eV or more, contamination is reliably prevented even if the electron temperature fluctuates depending on the pressure of the plasma process.

In the plasma processing apparatus of the RLSA type, microwaves are transmitted through the microwave transmission plate and brought into contact with a process gas immediately thereafter to generate plasma, which is uniformly diffused downward. In this case, the electron temperature is the highest in the vicinity of the microwave transmission plate. Accordingly, in the case of the plasma processing apparatus of the RLSA type, the area having an electron temperature of 1.5 eV or more is concentrated only near the microwave transmission plate. Therefore, where a metal member and so forth near the microwave transmission plate are covered, the area having an electron temperature of 1.5 eV or more is efficiently protected.

Preferable embodiments of the present invention will now be described with reference to the accompanying drawings.

Figure 1:
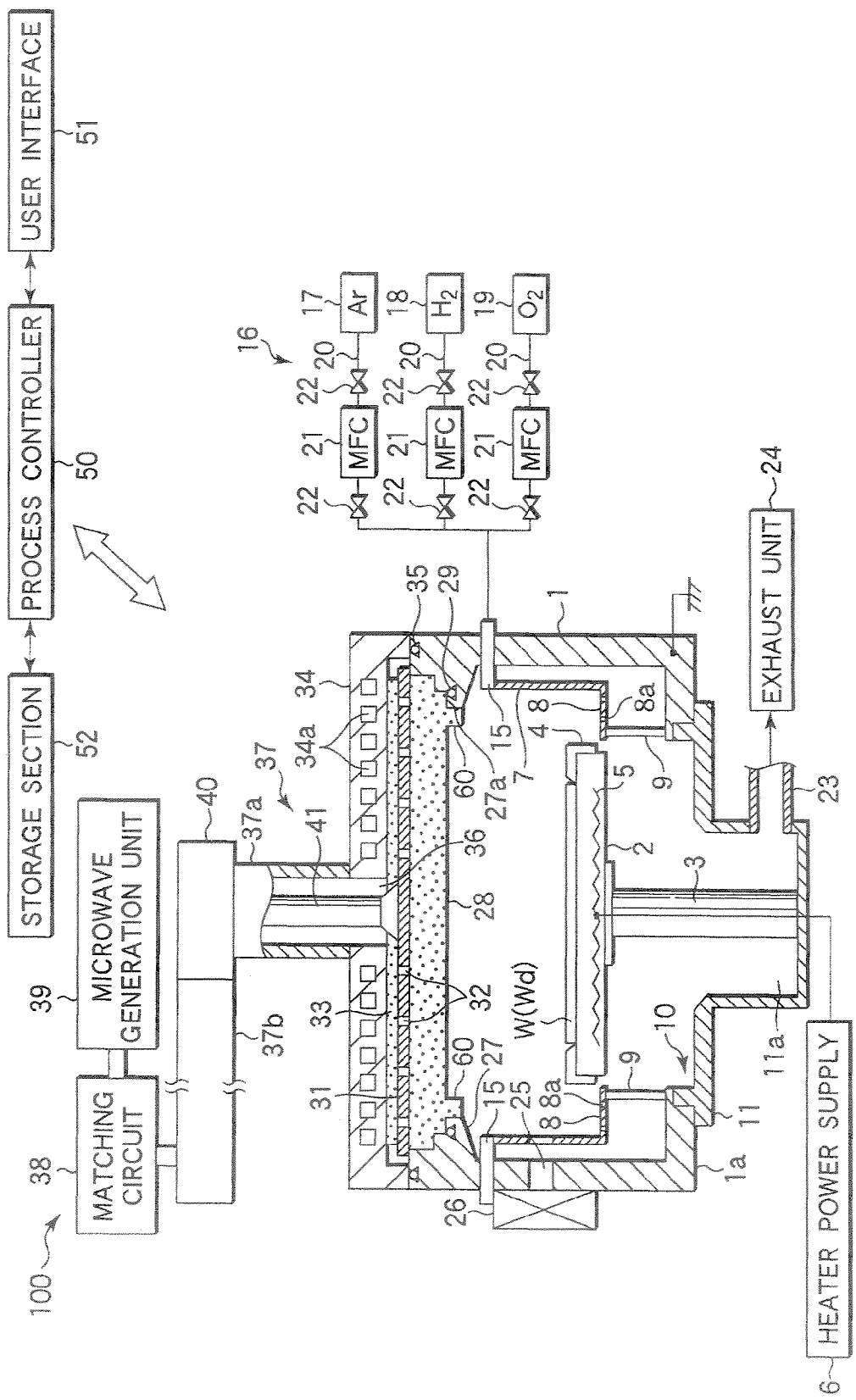
FIG. 1 This is a sectional view schematically snowing an example of a plasma processing apparatus according to a first embodiment of the present invention.

FIG. 1 is a sectional view schematically showing an example of a plasma processing apparatus according to an embodiment of the present invention. This plasma processing apparatus 100 is arranged as a plasma processing apparatus of the RLSA microwave plasma type, in which micro-waves are supplied from a planar antenna having a plurality of slots, such as an RLSA (Radial Line Slot Antenna), into a process chamber to generate microwave plasma with a high density and a low electron temperature.

This plasma processing apparatus 100 can proceed with a plasma process at a low temperature of 500° C. or less and free from damage to the underlying film and so forth. Further, this apparatus can provide good plasma uniformity, thereby realizing a uniform plasma process on a substrate. Accordingly, the plasma processing apparatus 100 is preferably usable for a process, such as plasma CVD.

This plasma processing apparatus 100 includes an essentially cylindrical chamber 1, which is airtight and grounded. The bottom wall 1a of the chamber 1 has a circular opening portion 10 formed essentially at the center, and is provided with an exhaust chamber 11 communicating with the opening portion 10 and extending downward. The chamber may have a prismatic shape (square shape) in place of the cylindrical shape.

The chamber 1 is provided with a susceptor 2 located therein and made of a ceramic, such as AlN, for supporting a target substrate, such as a wafer W or dummy wafer Wd, in a horizontal state. The susceptor 2 is supported by a cylindrical support member 3 made of a ceramic, such as AlN, and extending upward from the center of the bottom of the exhaust chamber 11. The susceptor 2 is provided with a guide ring 4 located on the outer edge to guide the wafer W. The susceptor 2 is further provided with a heater 5 of the resistance heating type built therein. The heater 5 is supplied with a power from a heater power supply 6 to heat the susceptor 2, thereby heating the target object or wafer W. For example, the heater 5 can control the temperature within a range of from about room temperature to 800° C. A cylindrical liner 7 made of a material, such as quartz, a ceramic, e.g., Al2O3, or a metal, is attached along the inner wall of the chamber 1 to maintain a clean state inside the chamber 1. The surface of the liner 7 may be covered with a coating layer having a plasma resistance, such as a layer of oxide of a rare-earth element, e.g., $Y_2O_3$. The outer periphery of the susceptor 2 is surrounded by an annular baffle plate 8, which is supported by a plurality of support members 9. The baffle plate 8 has a number of exhaust holes 8a and allows the interior of the chamber 1 to be uniformly exhausted.

The susceptor 2 is provided with wafer support pins (not shown) that can project and retreat relative to the surface of the susceptor 2 to support the wafer W and move it up and down.

A gas feed member 15 having an annular structure is attached in the sidewall of the chamber 1, and is connected to a gas supply system 16. The gas feed member may have a shower structure. The gas supply system 16 includes gas supply sources for supplying given gases in accordance with the process content. Although the gases are not limited to specific types, the system 16 shown in FIG. 1 includes an Ar gas supply source 17, an $H_2$ gas supply source 18, and an $O_2$ gas supply source 19, from which gases are supplied through respective gas lines 20 to the gas feed member 15 and are delivered from the gas feed member 15 into the chamber 1. Each of the gas lines 20 is provided with a mass-flow controller 21 and two switching valves 22 one on either side of the controller 21. As a process gas, a rare gas, such as Ar described above, may be used along with oxidizing gas, such as oxygen, for an oxidation process, or nitriding gas, such as $N_2$, for a nitridation process.

The sidewall of the exhaust chamber 11 is connected to an exhaust unit 24 including a high speed vacuum pump through an exhaust line 23. The exhaust unit 24 can be operated to uniformly exhaust the gas from inside the chamber 1 into the space 11a of the exhaust chamber 11, and then out of the exhaust chamber 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W or dummy wafer Wd is transferred between the plasma processing apparatus 100 and an adjacent transfer chamber (not shown) through the transfer port 25.

The top of the chamber 1 is opened and is provided with an annular support portion 27 along the periphery of the opening portion. A microwave transmission plate 28 is airtightly mounted on the support portion 27 through a seal member 29. The microwave transmission plate 28 is made of a dielectric material, such as quartz, $Al_2O_3$, or AlN to transmit microwaves. The interior of the chamber 1 is thus held airtight.

The support portion 27 for supporting the microwave transmission plate 28 is made of, e.g., an Al alloy or stainless steel, and has a horizontal support face and a wall 27a (or a part of the inner wall of the chamber 1) essentially perpendicular to the support face. The plasma processing apparatus 100 according to this embodiment further includes a covering portion 60 integrally formed with she microwave transmission plate 28 from the same material (preferably from quartz) to cover the vertical wail 27a. Where the covering portion 60 is formed integrally with the microwave transmission plate 28, the durability of these members becomes higher and the number of parts is decreased. The covering portion 60 may be prepared such that a projection is formed on the microwave transmission plate 28 at a position corresponding to the wall 27a, and then the surface of the projection is coated with, e.g., $Y_2O_3$. The entire surface or lower surface of the microwave transmission plate 28 may be coated with $Y_2O_3$ or the like. The entire surface of the members located at least inside the chamber 1 may be coated with $Y_2O_3$ or the like. The effect of the covering portion 60 will be described later.

Figure 2:
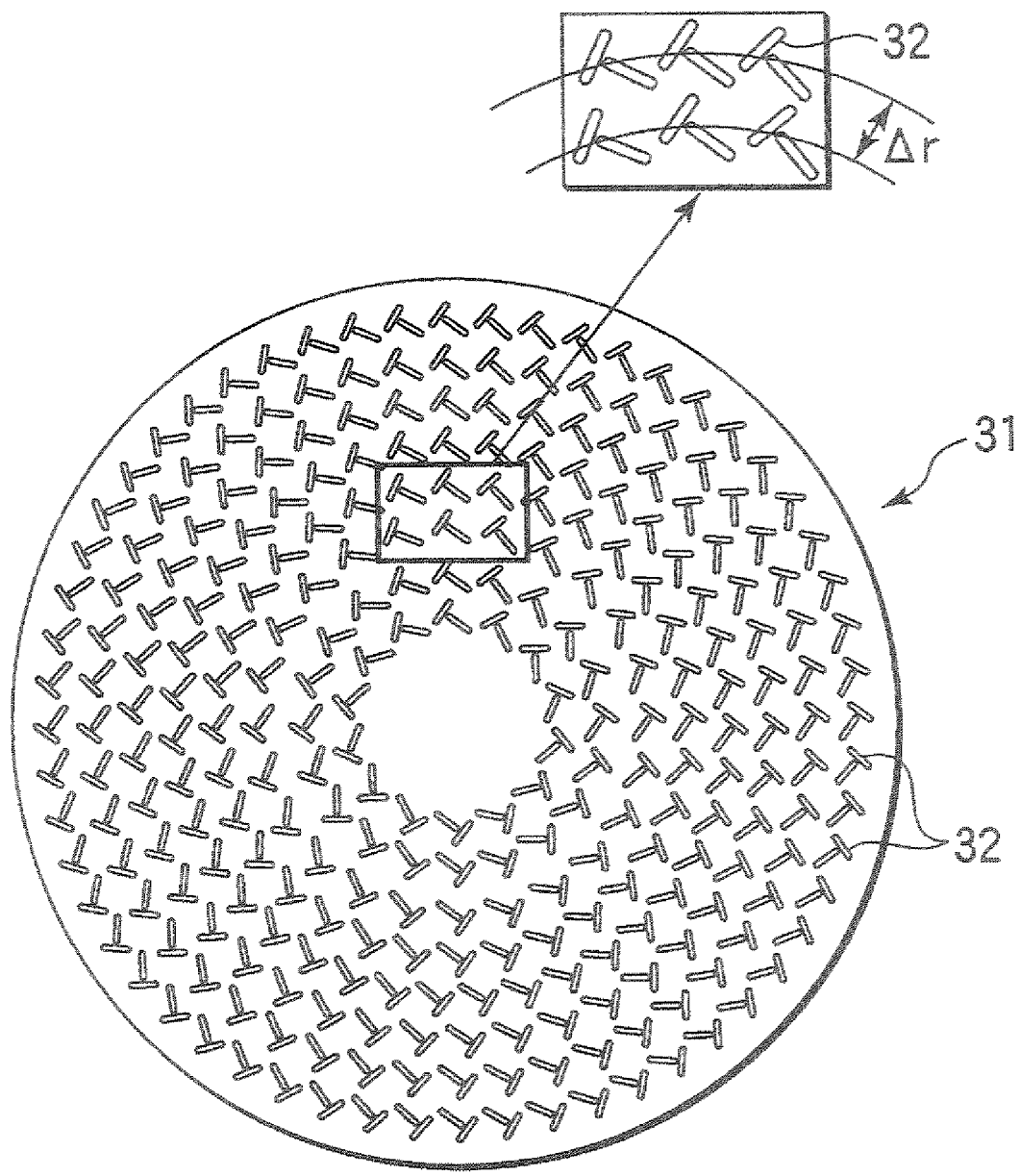
FIG. 2 This is a view showing the structure of a planar antenna member used in the plasma processing apparatus shown in FIG. 1.

A circular planar antenna member 31 is located above the microwave transmission plate 28 to face the susceptor 2. The planar antenna member may have a rectangular shape (square shape). The planar antenna member 31 is fixed to the upper end of the sidewall of the chamber 1. The planar antenna member 31 is formed of, e.g., a copper plate, Ni plate, or aluminum plate with the surface plated with silver or gold. The planar antenna member 31 has a number of microwave radiation holes 32 formed therethrough and arrayed in a predetermined pattern. For example, as shown in FIG. 2, the microwave radiation holes 32 are formed of long slits (slots), wherein the microwave radiation holes 32 are typically arranged such that adjacent holes 32 form a T-shape, and T-shapes are arrayed on a plurality of concentric circles. The length and array intervals of the microwave radiation holes 32 are determined in accordance with the wavelength ($\lambda$) of microwaves. For example, the intervals of the microwave radiation holes 32 are set to be $\frac{1}{2}\lambda$ or $\lambda$. In FIG. 2, the interval between adjacent microwave radiation holes 32 respectively on two concentric circles is expressed with $\Delta r$. The microwave radiation holes 32 may have another shape, such as a circular shape or arc shape. The array pattern of the microwave radiation holes 32 is not limited to a specific one, and, for example, it may be spiral or radial other than concentric.

A wave-retardation body 33 having a dielectric constant larger than that of vacuum is disposed on the top of the planar antenna member 31. The wave-retardation body 33 shortens the wavelength of microwaves to adjust plasma, because the wavelength of microwaves becomes longer in a vacuum condition. The planar antenna member 31 may be set in contact with the microwave transmission plate 28. Similarly, the wave-retardation body 33 may be set in contact with the planar antenna 31. The planar antenna member 31 and wave-retardation body 33 are covered with a shield lid 34 located at the top of the chamber 1. The shield lid 34 is made of a metal material, such as aluminum or stainless steel. A seal member 35 is interposed between the top of the chamber i and the shield lid 34 to seal this portion. The shield lid 34 is provided with a plurality of cooling water passages 34a formed therein. Cooling water is supplied to flow through the cooling water passages 34a and thereby cool the planar antenna member 31, microwave transmission plate 28, wave-retardation body 33, and shield lid 34. The shield lid 34 is grounded.

The shield lid 34 has an opening portion 36 formed at the center of the upper wall and connected to a wave guide tube 37. The wave guide tube 37 is connected to a microwave generation unit 39 at one end through a matching circuit 38. The microwave generation unit 39 generates microwaves with a frequency of, e.g., 2.45 GHz, which are transmitted through the wave guide tube 37 to the planar antenna member 31. The microwaves may have a frequency of 8.35 GHz or 1.98 GHz.

The wave guide tube 37 includes a coaxial wave guide tube 37a having a circular cross-section and extending upward from the opening portion 36 of the shield lid 34, and a rectangular wave guide tube 37b connected to the upper end of the coaxial wave guide tube 37a. A mode transducer 40 is interposed between the rectangular wave guide tube 37b and coaxial wave guide tube 37a to convert microwaves propagated in a TE mode through the rectangular wave guide tube 37b into a TEM mode. The coaxial wave guide tube 37a includes an inner conductive body 41 extending at the center, which is connected and fixed to the center of the planar antenna member 31 at the lower end. With this arrangement, microwaves are efficiently and uniformly propagated through the inner conductive body 41 of the coaxial wave guide tube 37a to the planar antenna member 31.

The respective components of the plasma processing apparatus 100 are connected to and controlled by a process controller 50. The process controller 50 is connected to a user interface 51 including, e.g. a keyboard and a display, wherein the keyboard is used for a process operator to input commands for operating the plasma processing apparatus 100, and the display is used for showing visualized images of the operational status of the plasma processing apparatus 100.

Further, the process controller 50 is connected to a storage section 52 that stores recipes containing control programs (software), process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated, line, as needed.

In the plasma processing apparatus 100 of the RLSA type thus arranged, a plasma process, such as reformation or film formation, is performed on a wafer W in the following sequence.

At first, the gate valve 26 is opened, and the wafer W is transferred through the transfer port 25 into the chamber 1 and placed on the susceptor 2.

Then, for example, Ar gas, $H_2$ gas, and $O_2$ gas are supplied at predetermined flow rates from the Ar gas supply source 17, $H_2$ gas supply source 18, and $O_2$ gas supply source 19 in the gas supply system 16 through the gas feed member 15 into the chamber 1, while it is maintained at a predetermined pressure.

Then, microwaves are supplied from the microwave generation unit 39 through the matching circuit 38 into the wave guide tube 37. The microwaves are supplied through the rectangular wave guide tube 37b, mode transducer 40, and coaxial wave guide tube 37a in this order to the planar antenna member 31 uniformly outward in the radial direction of the planar antenna member 31. Then, the microwaves are radiated as electromagnetic waves from the microwave radiation holes 32 of the planar antenna member 31 through the microwave transmission plate 28 into the space above the wafer W within the chamber 1. The microwaves are propagated in a TE mode through the rectangular wave guide tube 37b, and are then transduced from the TE mode into a TEM mode by the mode transducer 40 and propagated in the TEM mode through the coaxial wave guide tube 37a to the planar antenna member 31.

When the microwaves are radiated from the planar antenna member 31 through the microwave transmission plate 28 into the chamber 1, given gases (for example, Ar gas, $H_2$ gas, and $O_2$ gas in the apparatus shown in FIG. 1) are turned into plasma, by which a process (for example, reformation or film formation) is performed on the wafer W. This microwave plasma has a plasma density of about $1 \times 10^{11}$ to $1 \times 10^{13}/cm^3$ and a low electron temperature of about 1.5 eV or less near the wafer W. Accordingly, this plasma has merits such that a process can be performed at a low temperature and in a short time, while the underlying film suffers less plasma damage due to ions and so forth.

Figure 3:
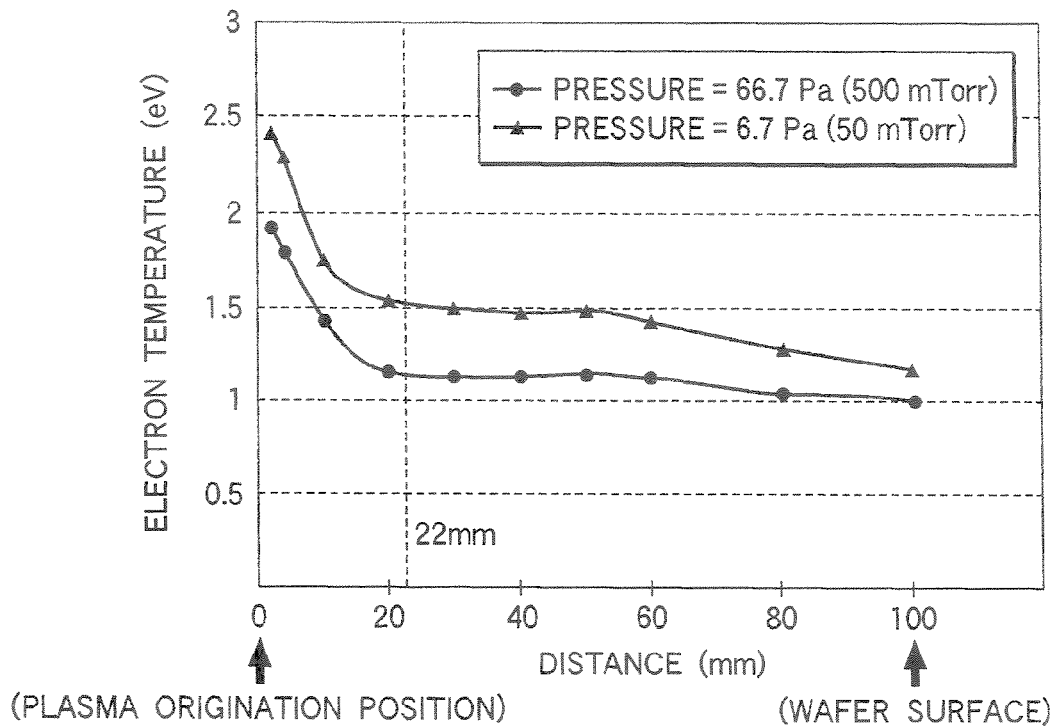
FIG. 3 This is a graph showing a result of measurement on the electron temperature distribution inside a chamber.

Next, with reference to FIG. 3, an explanation will be given of experimental data on which the present invention was made. By use of a plasma processing apparatus 100 having the same structure as shown in FIG. 1, a plasma process was imitatively performed on a dummy wafer Wd, and the electron temperature inside the chamber 1 was measured during this process. FIG. 3 is a graph showing a result of this experiment, wherein the vertical axis denotes the electron temperature (eV), and the horizontal axis denotes the distance (mm) to the dummy wafer Wd from the plasma origination position (the lower surface of the microwave transmission plate 28) set as a zero point. In the plasma process conditions used for this experiment, the process gas was Ar set at a flow rate of 500 mL/min(sccm), the pressure was set at 6.7 Pa (50 mTorr) or 66.7 Pa (500 mTorr), and the supply power to plasma was set at 1.6 kW.

As shown in FIG. 3, the electron temperature inside the chamber differed depending on the pressure used for the plasma process. However, in either case setting the pressure at 6.7 Pa (50 mTorr) or 66.7 Pa (500 mTorr), the electron temperature was rapidly decreased in a zone or region of from the zero point, i.e., the plasma origination position or the lower surface of the microwave transmission plate 28, to a position of about 22 mm therefrom, and then became less than 1.5 eV at a position beyond this region. This is thought to be an electron temperature distribution peculiar to the plasma processing apparatus 100 of the RLSA type, in which microwaves are radiated from the planar antenna member 31 so that plasma is uniformly generated in the space within the process chamber.

From the results described above, the following matters have been found. Specifically, in the plasma processing apparatus 100, a region of from the microwave transmission plate 28 set as the zero point to a position of about 22 mm therefrom is an area where the electron temperature takes on a high value of 1.5 eV or more during plasma generation. If a metal is exposed in this area, the metal is likely to be sputtered by ions in plasma and to bring about metal contamination on the wafer W by scattered metal. Accordingly, at least within she area near the microwave transmission plate 28 with an electron temperature of 1.5 eV or more, metal members present therein are covered with a plasma resistant material, such as a heat resistant insulator, e.g., quartz or $Y_2O_3$. With this arrangement, the metal members are prevented from being exposed, and the metal contamination on the wafer W is drastically decreased. This region of from the lower surface of the microwave transmission plate 28 to a position of about 22 mm therefrom almost corresponds to the wall 27a of the support portion 27 in the case of the apparatus shown in FIG. 1.

Figure 4:
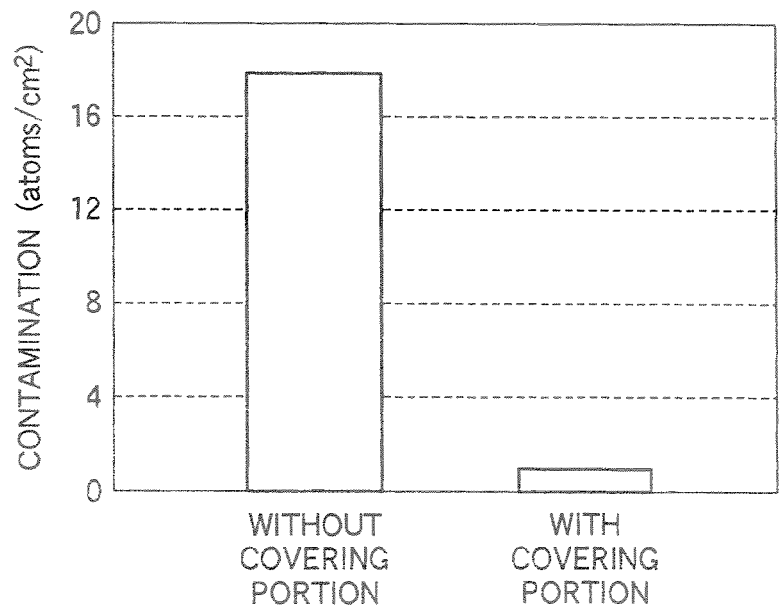
FIG. 4 This is a graph showing the level of aluminum contamination on a wafer after a plasma process.

Further, although it is not shown here, where the process pressure is set at 0.67 Pa (5 mTorr), the electron temperature is thought to be 1.5 eV or more in a region of from the lower surface of the microwave transmission plate 28 set as the zero point to a position of about 80 mm therefrom. Accordingly, where the plasma process pressure is set at an ordinary value of about 0.67 Pa (5 mTorr) to 133 Pa (1 Torr), it is likely to suffice that, at least within the region of from the lower surface of the microwave transmission plate 28 to a position of about 80 mm therefrom, metal members present therein are covered as described above, By use of the plasma processing apparatus 100 shown in FIG. 1, a plasma process was performed on a wafer W, while the flow rate ratio of the process gas was set at $Ar/O_2/H_2$=1,000/100/200 mL/min (sccm), the pressure at 6.7 Pa (50 mTorr), the wafer temperature at 400° C., and the supply power to plasma at 3.4 kW. Then, the level of Al contamination on the wafer W was measured by an ICP-Mass method. For comparison, the same process was performed by use of a plasma processing apparatus including no covering portion 60. FIG. 4 is a graph showing a result of this experiment.

As shown in FIG. 4, where the plasma process was performed by use of the plasma processing apparatus 100 including the covering portion 60, the level of Al contamination on the wafer W was far lower than that obtained by the plasma processing apparatus including no covering portion 60.

Figure 5:
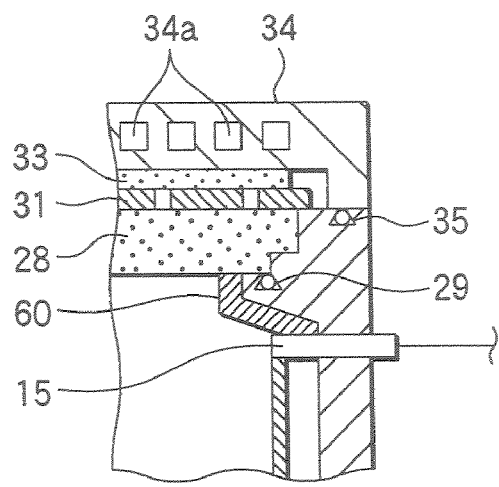
FIG. 5 This is a sectional view showing main parts of a plasma processing apparatus according to a second embodiment of the present invention.
Figure 6:
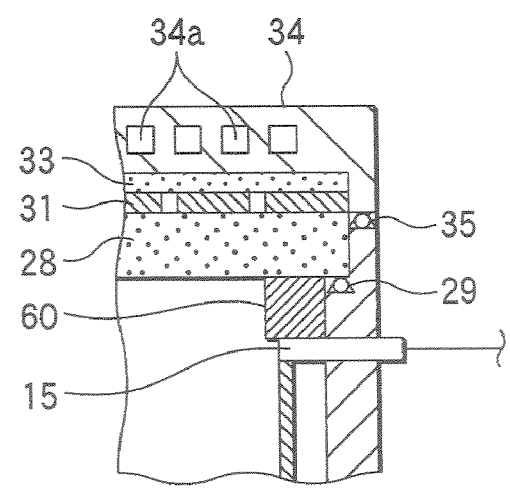
FIG. 6 This is a sectional view showing main parts of a plasma processing apparatus according to a third embodiment of the present invention.
Figure 7:
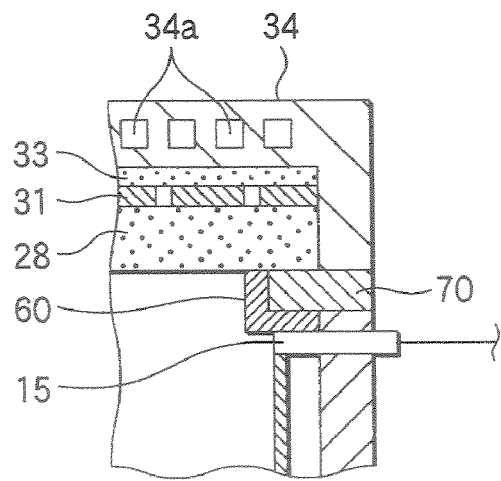
FIG. 7 This is a sectional view showing main parts of a plasma processing apparatus according to a fourth embodiment of the present invention.

FIGS. 5 to 7 are sectional views schematically showing main parts of a plasma processing apparatus according to second to fourth embodiments of the present invention, respectively. In the plasma processing apparatus 100 according to the first embodiment shown in FIG. 1, the covering portion 60 is integrally formed with the microwave transmission plate 28. In the second embodiment, as shown in FIG. 5, a covering portion 60 is formed as a member independent of the microwave transmission plate 28. In this case, the covering portion 60 is formed of a ring of a plasma resistant material, such as an insulator, e.g., quartz or $Y_2O_3$, and disposed in contact with the chamber inner wail.

Further, in the first embodiment (FIG. 1), only a portion near the microwave transmission plate 28 is covered. In the second embodiment, the covering portion 60 is further elongated downward to cover the wall surface extending to the gas feed member 15. It may be arranged such that all the exposed surfaces of the metal members inside the chamber 1 are covered. In FIG. 5, the cross-section of the covering portion 60 is depicted as a thick member, but the covering portion 60 may be a coating film of $Y_2O_3$ or the like coated by, e.g., a thermal spray method (atmospheric pressure plasma thermal spray or vacuum pressure plasma thermal spray), a sputtering method, or an ion plating method.

In the third embodiment, as shown in FIG. 6, a covering portion 60 is formed of a ring disposed to cover a wail surface extending from the lower surface of the microwave transmission plate 28 to the gas feed member 15. In this embodiment, the microwave transmission plate 28 is supported on a step portion formed at the upper end of the sidewall of the chamber 1.

In the fourth embodiment, as shown in FIG. 7, the microwave transmission plate 28 is supported by a metal support member 70 disposed at the upper end of the sidewall of the chamber 1. A covering portion 60 formed of a ring having an L-shape in a cross section is disposed to cover the support member 70. Since the support member 70 is detachable, the covering portion 60 can be detached and replaced along with the support member 70, when the covering portion 60 is degraded in protective function due to plasma attack. Further, the support member 70 thus detached may be reused by providing a new covering portion 60 on the surface thereof. In the embodiments shown in FIGS. 6 and 7, the covering portion 60 may be a coating film of $Y_2O_3$ or the like coated by, e.g., a thermal spray method (atmospheric pressure plasma thermal spray or vacuum pressure plasma thermal spray), a sputtering method, or an ion plating method.

The other portions of the structures shown in FIGS. 5 to 7 are the same as those of the embodiment shown in FIG. 1. Accordingly, only main parts are shown here, while the same constituent elements are denoted by the same reference numerals, and description thereon is omitted.

Figure 8:
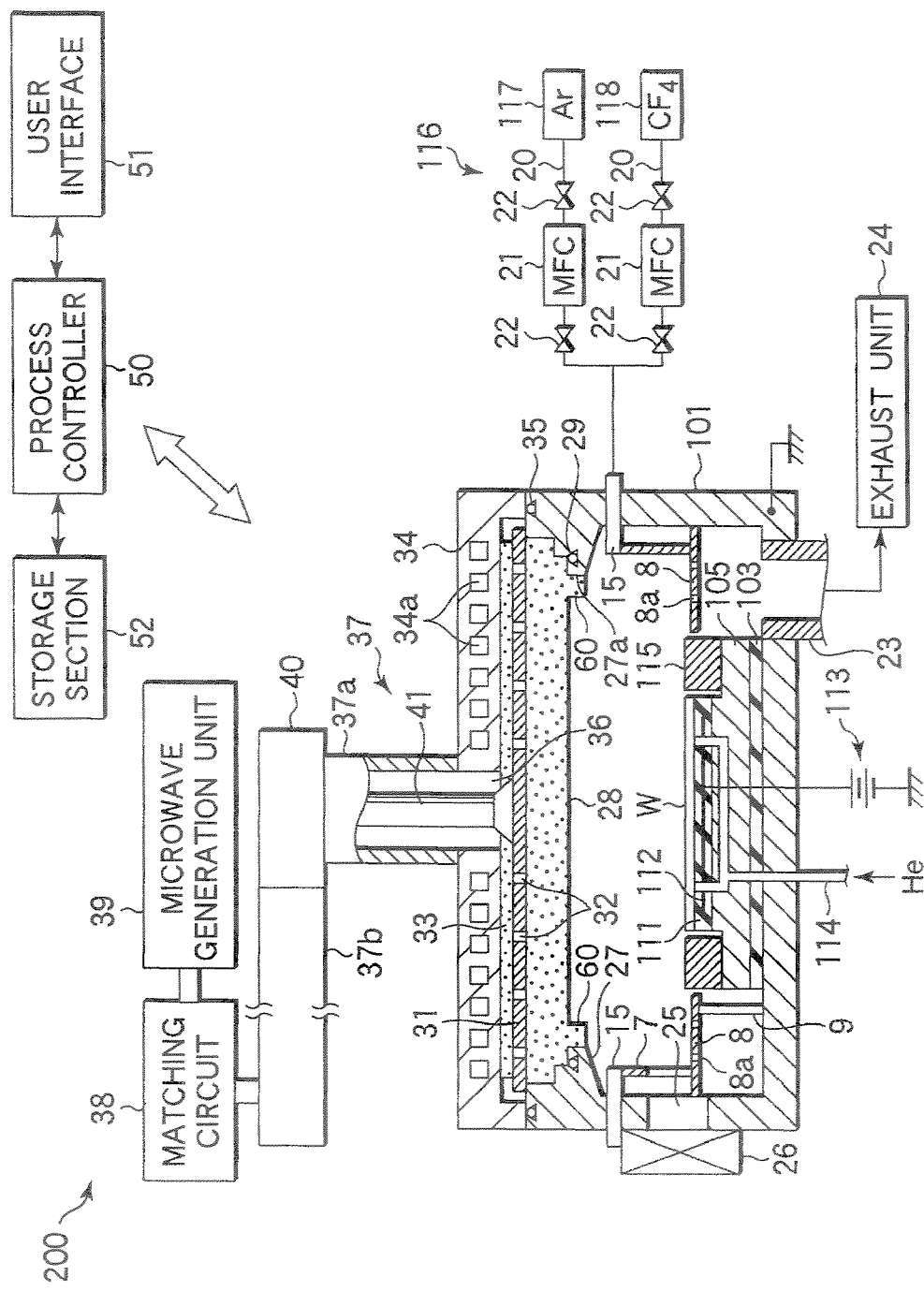
FIG. 8 This is a sectional view schematically showing an example of a plasma processing apparatus according to a fifth embodiment of the present invention.

FIG. 8 is a section view schematically showing a plasma processing apparatus 200 according to a fifth embodiment, which is an etching apparatus preferably usable for performing a dry etching process on a wafer W. As in the plasma processing apparatus 100 shown in FIG. 1, this plasma processing apparatus 200 is also arranged as a plasma processing apparatus of the RLSA microwave plasma type, in which microwaves are supplied from a planar antenna having a plurality of slots, such as an RLSA, into a process chamber to generate microwave plasma with a high density and a low electron temperature.

Since the plasma processing apparatus 200 is structured as an etching apparatus, this apparatus is provided with a gas supply system 116 including an Ar gas supply source 117 and a $CF_4$ gas supply source 118 as gas supply sources, for example. The process gas is not limited to a CF family gas, and, for example, it may be a halogen gas, such as chlorine or bromine, or a halogenated compound gas, such as a CHF family gas, in accordance with the purpose of an etching process. The plasma processing apparatus 200 includes a chamber 101 provided with a susceptor 105 located therein for supporting a wafer W with a predetermined film formed thereon, in a horizontal state. The top central portion of the susceptor 105 is projected like a circular plate, which is provided with an electrostatic chuck 111 having essentially the same shape as the wafer W. The electrostatic chuck 111 comprises an electrode 112 and insulating layers sandwiching the electrode 112. The electrode 112 is connected to a direct-current (DC) power supply 113, and supplied with a DC voltage of, e.g., 1.5 kV therefrom, so that the wafer W is attracted and held by an electrostatic force, such as a Coulomb force.

The outer periphery of the susceptor 105 is surrounded by a baffle plate 8, which has a number of exhaust holes 8a and allows the interior of the chamber 101 to be uniformly exhausted. An exhaust space is formed below the baffle place 8 to surround the susceptor 105, and the chamber 101 is connected through the exhaust space and an exhaust line 23 to an exhaust unit 24 to uniformly exhaust the interior of the chamber 101.

The susceptor 105 is provided with a temperature adjusting medium space (not shown) formed therein to supply and circulate a temperature adjusting medium to adjust the susceptor 105 at a predetermined temperature. Further, a gas passage 114 is formed in an insulating plate 103, the susceptor 105, and the electrostatic chuck 111 to supply a heat transmission medium, such as He gas, at a predetermined pressure (back side pressure) to the back side of a target object or wafer W. Heat is transmitted between the susceptor 105 and wafer W through the heat transmission medium, thereby maintaining the wafer W at a predetermined temperature.

An annular focus ring 115 is disposed on the top of the susceptor 105 at the rim to surround the wafer W placed on the electrostatic chuck 111. The focus ring 115 is made of an insulative material, such as a ceramic or quartz, to improve the etching uniformity.

In the plasma processing apparatus 200, microwaves generated from the microwave generation unit 39 are supplied through the matching circuit 38, rectangular wave guide tube 37b, mode transducer 40, and coaxial wave guide tube 37a in this order to the planar antenna member 31. Then, the microwaves are radiated from the microwave radiation holes 32 of the planar antenna member 31 through the microwave transmission plate 28 into the space above the wafer W within the chamber 1. When the microwaves are radiated into the chamber 1, etching gases (for example, Ar gas and $CF_4$ gas in the apparatus shown in FIG. 8) are turned into plasma, by which an etching process is performed on the wafer W. Also in the plasma processing apparatus 200, since a covering portion 60 is disposed to cover a wall 27a, it is possible to protect the wall 27a and to prevent contamination by a metal, such as Al.

The other portions of the plasma processing apparatus 200 shown in FIG. 8 are the same as those of the plasma processing apparatus 100 shown in FIG. 1. Accordingly, the same constituent elements are denoted by the same reference numerals, and description thereon is omitted. Further, the plasma processing apparatus 200 according to the fifth embodiment shown in FIG. 8 may be modified in accordance with the second to fourth embodiments shown in FIGS. 5 to 7.

The present invention has been described with reference to embodiments, but the present invention is not limited to the embodiments described above, and it may be modified in various manners.

For example, each of FIGS. 1 and 8 shows a plasma processing apparatus 100 or 200 of the RLSA type as an example, but this is not limiting, as long as the apparatus can be used for processing a target substrate by use of plasma. The present invention may be applied to a plasma processing apparatus of another type, such as the capacitive coupling type or inductive coupling type.

Further, the embodiments described above are exemplified by a plasma processing apparatus for processing a silicon wafer. However, the present invention may be applied to a plasma processing apparatus for processing another target substrate for, e.g., FPDs (flat panel display), such as liquid crystal displays.

INDUSTRIAL APPLICABILITY

The present invention is preferably applicable to a film formation process for forming, e.g., a silicon oxide film or silicon nitride film on a substrate, or a reformation or etching process for processing such a film, in the process of manufacturing various semiconductor devices.

The invention claimed is:

1. A plasma processing apparatus comprising:
   a process chamber configured to perform a plasma process on a target substrate, the process chamber including a chamber casing that defines a surrounding sidewall and a microwave transmission plate consisting of a dielectric body and airtightly closing a ceiling portion of the chamber casing;
   a substrate worktable disposed inside the chamber casing and configured to place the target substrate thereon;
   a gas supply system configured to supply a process gas into the process chamber;
   an exhaust system configured to decrease pressure inside the process chamber;
   a planar antenna disposed outside the microwave transmission plate in parallel with the microwave transmission plate and having a plurality of slots, from which microwaves are supplied into the process chamber through the microwave transmission plate to generate plasma; and
   a wave guide tube connected to a center of an upper side of the planar antenna from above and configured to guide the microwaves generated in a microwave generation unit to the planar antenna,
   wherein the chamber casing includes an annular support portion formed integrally with the surrounding sidewall and extending inward from the surrounding sidewall, such that the annular support portion is defined by a lower face inclined inward and upward from the surrounding sidewall, a rising face extending upward from an inner end of the lower face, and a supporting upper face equipped with a plurality of step portions and inclined outward and upward as a whole from an upper end of the rising face, the microwave transmission plate includes an engaging face formed on a peripheral side and equipped with a plurality of step portions having complementary shapes relative to the plurality of step portions of the supporting upper face of the annular support portion, such that the microwave transmission plate is supported by the chamber casing through the engaging face fitted on the supporting upper face, and the microwave transmission plate further includes a covering portion formed integrally therewith and extending downward from a position on an inner side of the engaging face, such that the covering portion protrudes down to the inner end of the lower face of the annular support portion and covers the rising face of the annular support portion;

wherein the rising face of the annular support portion is within an area defined between the microwave transmission plate and a position 22-mm distant therefrom.

2. The plasma processing apparatus according to claim 1, wherein the covering portion and the microwave transmission plate consist essentially of quartz.

3. The plasma processing apparatus according to claim 1, wherein the annular support portion consists essentially of a metal.

4. The plasma processing apparatus according to claim 3, wherein the lower face of the annular support portion and the covering portion are covered with $Y_2O_3$.

5. The plasma processing apparatus according to claim 1, wherein the rising face of the annular support portion is within an area in which the plasma generated inside the process chamber has an electron temperature of 1.5 eV or more.

6. The plasma processing apparatus according to claim 1, wherein the apparatus further comprises a liner that covers the surrounding sidewall of the chamber casing from inside, the liner having an inner surface covered with $Y_2O_3$.

7. The plasma processing apparatus according to claim 1, wherein the apparatus further comprises an exhaust chamber airtightly connected to a bottom of the chamber casing and the exhaust system is connected to the exhaust chamber.

8. The plasma processing apparatus according to claim 1, wherein the gas supply system is configured to supply, as the process gas, a gas for forming a film by CVD on the target substrate.

9. The plasma processing apparatus according to claim 1, wherein the planar antenna is fixed to a portion formed integrally with the surrounding sidewall above the supporting upper face of the annular support portion.

10. The plasma processing apparatus according to claim 1, wherein the planar antenna is set in contact with the microwave transmission plate.

11. The plasma processing apparatus according to claim 1, wherein the apparatus further comprises a wave-retardation body disposed above the planar antenna and configured to shorten wavelength of the microwaves to adjust the plasma.

12. The plasma processing apparatus according to claim 1, wherein the slots of the planar antenna are T-shaped.

* * * * *